US008275589B2

(12) United States Patent
Montaron et al.

(10) Patent No.: US 8,275,589 B2
(45) Date of Patent: Sep. 25, 2012

(54) MODELING A RESERVOIR USING A COMPARTMENT MODEL AND A GEOMECHANICAL MODEL

(75) Inventors: Bernard Andre Montaron, Dubai (AE); Kamal Babour, Bures sur Yvette (FR); George Zangl, Laxenburg (AT); Rutger Gras, Arnhem (NL); Andrew Pearce, Leatherhead (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 529 days.

(21) Appl. No.: 12/392,464

(22) Filed: Feb. 25, 2009

(65) Prior Publication Data
US 2010/0217563 A1   Aug. 26, 2010

(51) Int. Cl.
G06F 17/50 (2006.01)
G06F 7/60 (2006.01)
G06F 15/18 (2006.01)
G06G 7/48 (2006.01)
G01V 1/40 (2006.01)
G06E 1/00 (2006.01)

(52) U.S. Cl. ............ 703/6; 702/6; 702/7; 702/9; 702/11; 702/13; 702/14; 702/18; 703/1; 703/2; 703/5; 703/7; 703/10; 706/13; 706/20; 706/21

(58) Field of Classification Search .................. 703/2, 6, 703/7, 9, 10, 1, 5; 702/2, 12, 6, 7, 9, 11, 702/13, 14, 18; 706/13, 20, 21
See application file for complete search history.

(56) References Cited

U.S. PATENT DOCUMENTS

| | | | | |
|---|---|---|---|---|
| 5,835,882 A * | 11/1998 | Vienot et al. | ....................... | 702/7 |
| 6,473,696 B1 * | 10/2002 | Onyia et al. | ....................... | 702/6 |
| 6,751,558 B2 * | 6/2004 | Huffman et al. | ................. | 702/14 |
| 6,766,255 B2 * | 7/2004 | Stone | ............................... | 702/13 |
| 7,177,764 B2 * | 2/2007 | Stone | ................................ | 702/6 |
| 7,305,306 B2 * | 12/2007 | Venkataramanan et al. | ...... | 702/9 |
| 7,565,278 B2 * | 7/2009 | Li et al. | ........................... | 703/10 |
| 7,620,534 B2 * | 11/2009 | Pita et al. | ........................ | 703/10 |
| 7,707,018 B2 * | 4/2010 | Shaw | ............................... | 703/10 |
| 7,742,875 B2 * | 6/2010 | Li et al. | .......................... | 702/12 |

(Continued)

FOREIGN PATENT DOCUMENTS
GB   2468184 B   8/2011
(Continued)

OTHER PUBLICATIONS

Khalmanova et al. "Geomechanical modeling of subsidence and compaction in the M1 and Jintan gas fields, offshore Malaysia", 2008, ARMA, American Rock Mechanics Association.*

(Continued)

*Primary Examiner* — Hugh Jones
*Assistant Examiner* — Shambhavi Patel

(57) ABSTRACT

An efficient and cost-effective technique is provided to perform modeling of a reservoir in a subterranean structure. A compartment model of fluid compartments in a reservoir is generated, and based on the compartment model and a geomechanical model of the subterranean structure, movement of a ground surface due to volumetric change of the compartments is calculated. Satellite measurements of the ground surface are received over time, where the received satellite measurements of the ground surface over time indicate movement of the ground surface. The movement of the ground surface indicated by the received satellite measurements is compared with the calculated movement, and based on the comparing, one or more properties of the geomechanical model are adjusted.

16 Claims, 6 Drawing Sheets

U.S. PATENT DOCUMENTS

| | | | | |
|---|---|---|---|---|
| 7,859,943 | B2* | 12/2010 | Herwanger | 367/38 |
| 2003/0201098 | A1* | 10/2003 | Karanikas et al. | 166/53 |
| 2006/0129366 | A1* | 6/2006 | Shaw | 703/10 |
| 2007/0016389 | A1* | 1/2007 | Ozgen | 703/10 |
| 2007/0198234 | A1 | 8/2007 | Zangl | |
| 2009/0043554 | A1* | 2/2009 | Horne et al. | 703/10 |
| 2009/0187391 | A1* | 7/2009 | Wendt et al. | 703/7 |

FOREIGN PATENT DOCUMENTS

| | | |
|---|---|---|
| NO | 20100274 A | 8/2010 |
| WO | 2007/067824 | 4/2007 |
| WO | 2007067824 A2 | 6/2007 |
| WO | 2008/046833 | 4/2008 |
| WO | 2008046833 A1 | 4/2008 |

OTHER PUBLICATIONS

Xu et al. "Integrating reservoir engineering and satellite remote sensing for (true) continuous time-lapse reservoir monitoring", The Leading Edge, Oct. 2001.*

Schutjens et al. "Depletion-induced reservoir compaction: Two geomechanical models and their application in the planning of subsidence monitoring", 2008, ARMA, American Rock Mechanics Association.*

Minkoff et al."Coupled geomechanics and flow simulation for time-lapse seismic modeling", Geophysics, vol. 69, No. 1 (Jan.-Feb. 2004); p. 200-211.*

Bos et al. "Time-dependent Inversion of Surface Subsidence due to Dynamic Reservoir Compaction", Math Geosci (2008) 40: 159-177.*

Stenvold, Torkjell. "Offshore Gravimetric and Subsidence Monitoring", Jun. 2008.*

Vasco et al. "Reservoir monitoring and characterization using satellite geodetic data: Interferometric Synthetic Aperture Radar observations from the Krechba field, Algeria", May 2008.*

Friedrich et al. "Geomechanical Modeling of Reservoir Compaction, Surface Subsidence, and Casing Damage at the Belridge Diatomite Field", SPE Reservoir Eval. & Eng. 3 ~4!, Aug. 2000.*

Longuemare et al. "Geomechanics in Reservoir Simulation: Overview of Coupling Methods and Field Case Study", Oil & Gas Science and Technology—Rev. IFP, vol. 57 (2002), No. 5, pp. 471-483.*

Hansen, et al., Modeling of reservoir compaction and surface subsidence at South Belridge, SPE Production & Facilities, Aug. 1995, pp. 134-135.

TNO Knowledge for Business, "Disentangling Deep and Shallow Causes of Subsidence", Exploration and Production, TNO Built Environment and Geosciences, Geological Survey of the Netherlands, 2007.

Amundsen, "Advanced Remote Sensing", GEO ExPro, pp. 36-38, Dec. 2008.

Odijk, "Integration of Leveling and Insar Data for Land Subsidence Monitoring", Proceedings, 11th FIG Symposium on Deformation Measurements, Santorini, Greece, 2003.

Xu, "Integrating Reservoir Engineering and Satellite Remote Sensing for (True) Continuous Time-Lapse Reservoir Monitoring", The Leading Edge, pp. 1176-1179, Oct. 2001.

Xu, "Linking Oil Production to Surface Subsidence from Satellite Radar Interferometry", Geophysical Research Letters, vol. 28, No. 7, pp. 1307-1310, Apr. 1, 2001.

Patzek, "Use of Satellite Radar Images in Surveillance and Control of Two Giant Oilfields in California", SPE Annual Technical Conference and Exhibition, New Orleans, SPE 71610, 2001.

Al-Thuwaini, "Innovative Approach to Assist History Matching Using Artificial Intelligence," SPE 99882, 2006.

Zangl, "Application of Artificial Intelligence in Gas Storage Management", SPE 100133, 2006.

Zangl, "Waterflood Pattern Optimization Using Genetic Algorithms with Multi-tank Material Balance", SPE 90259, 2004.

Hansen, K.S. et al., "Modeling of Reservoir Compaction and Surface Subsidence at South Belridge", SPE Production & Facilities, Aug. 1995, pp. 134-143.

* cited by examiner

MODELING A RESERVOIR USING A COMPARTMENT MODEL AND A GEOMECHANICAL MODEL

BACKGROUND

To extract hydrocarbons or other fluids from a reservoir in a subterranean structure, one or more wells are drilled into the subterranean structure to intersect the reservoir. Alternatively, instead of extracting fluids from a reservoir, fluids can be injected into the reservoir. The main reason for injecting fluids into a reservoir is pressure maintenance. Hydrocarbons that are produced are replaced by some fluid for proper recovery to take place. The least expensive and most abundant fluid is sea water and many oil reservoirs in the world are under sea water injection. Natural gas can also be injected to maintain pressure but this is now often considered too expensive and other fluids tend to be preferred. As reservoirs become more and more mature the need to apply enhanced oil recovery (EOR) techniques increases. Examples of EOR fluids that can be injected to help displace hydrocarbons include alkali-surfactant-polymer (ASP) fluids, water alternate gas (WAG), nitrogen, and carbon dioxide. Another example of fluid injection is in the context of carbon dioxide sequestration, in which carbon dioxide can be injected into a depleted reservoir for storage.

As a result of fluid-related operations (production or injection), compaction or expansion of one or more portions of the reservoir may occur. Over the life of a reservoir, an operator may wish to monitor the reservoir for changes. This can be performed by integrating measurements into a reservoir model. However, conventionally, techniques are not available to efficiently model reservoirs that account for compaction or expansion caused by fluid-related operations.

SUMMARY

In general, according to an embodiment, a more efficient and cost-effective technique is provided to perform modeling of a reservoir in a subterranean structure. In one embodiment, a compartment model of compartments in a reservoir is generated using a combination of reservoir production data history and geological and structural knowledge, and based on the compartment model and a geomechanical model of the subterranean structure, movement of a ground surface due to volumetric change of the compartments is calculated. Satellite measurements of the ground surface movements are received over time, where the received satellite measurements of the ground surface over time indicate movement of the ground surface. The movement of the ground surface indicated by the received satellite measurements is compared with the calculated movement, and based on the comparing, one or more properties of the geomechanical model are adjusted.

Other or alternative features will become apparent from the following description, from the drawings, and from the claims.

DETAILED DESCRIPTION

In the following description, numerous details are set forth to provide an understanding of various embodiments. However, it will be understood by those skilled in the art that the other embodiments may be practiced without these details and that numerous variations or modifications from the described embodiments are possible.

Figure 1:
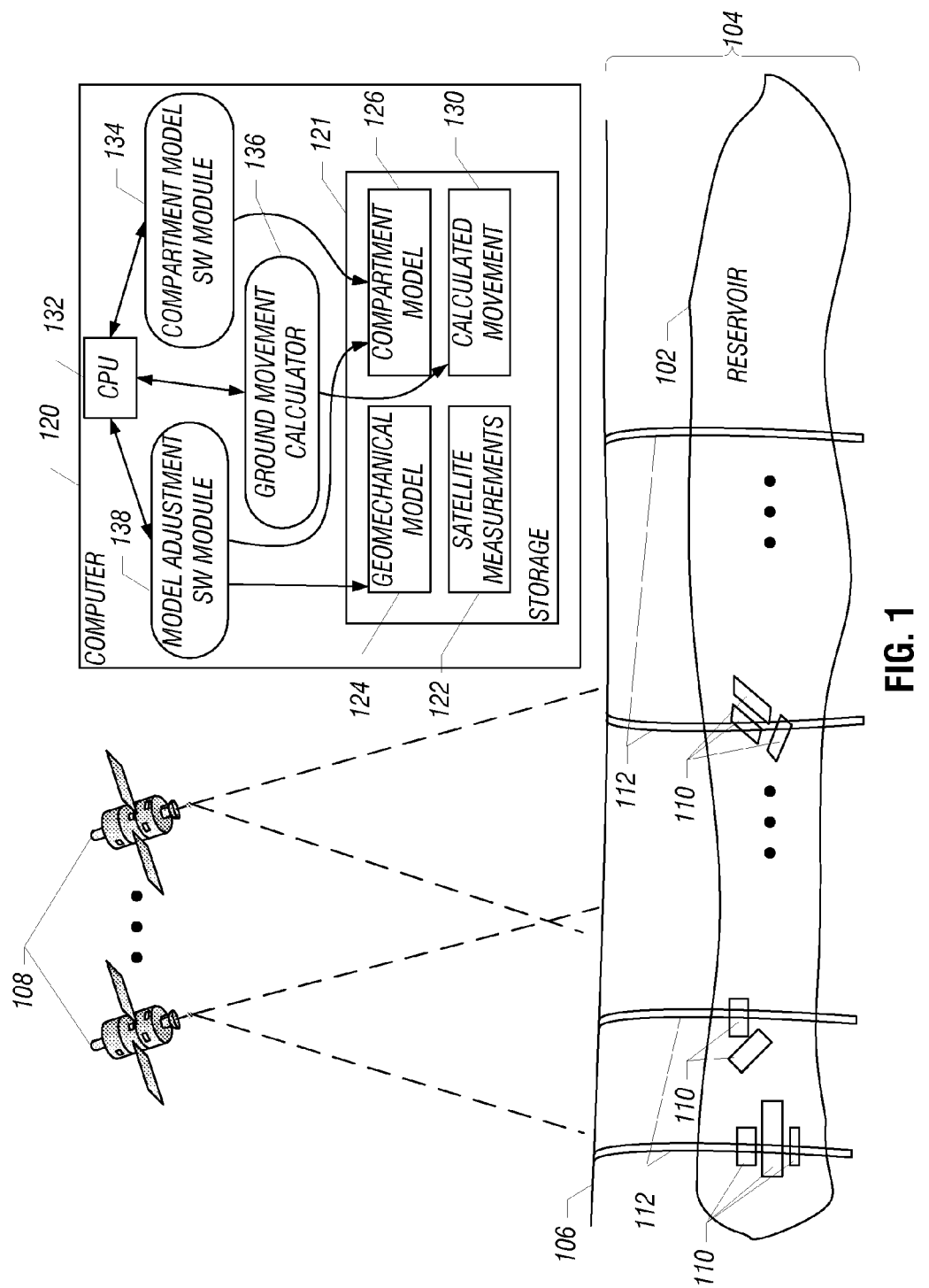
FIG. 1 is a schematic diagram of an exemplary arrangement in which an embodiment of modeling a reservoir using a compartment model and a geomechanical model can be incorporated.

FIG. 1 illustrates an exemplary arrangement in which some embodiments of modeling a reservoir using a compartment model and a geomechanical model can be incorporated. A reservoir 102 is depicted in a subterranean structure 104 below a ground surface 106. Although just one reservoir is depicted, it is noted that multiple reservoirs can be present. Also depicted are satellites 108 that are used to perform measurements of the ground surface 106. In some implementations, the satellites 108 can perform remote measurements of a ground surface to detect up or down movement of the ground surface. One implementation of such a technique is referred to as an Interferometric Synthetic Aperture Radar (InSAR) technology. The InSAR technology employs microwave signals to measure up and down movements of the ground surface 106. The up and down measurements of movement of the ground surface 106, over time, can be performed at multiple individual areas of the ground surface 106. The vertical resolution of the up and down movement of the ground surface 106 can be a few millimeters or less. This relatively high resolution can be compared to the subsidence experienced in some oil and gas fields that can exceed several centimeters per year.

With the InSAR technology, each satellite makes at least two radar surveys of the ground surface above the monitored reservoir taken at different times (e.g., 6 months apart or more depending on the importance of the subsidence). The two radar surveys (or images) undergo a computer interference treatment to produce a numerical data set of the up and down movements of the ground. The color coding of this data set produces an image of the ground surface that shows various interference fringes corresponding to the amplitude of the vertical movement of the ground surface. The horizontal resolution of such images with modern satellite technology is on the order of a few meters or better. This means that vertical movements of the ground surface can be provided for each cell of a grid—for example a square grid—with a dimension of each grid cell being on the order of a few meters or less. These InSAR surveys can be repeated over the life of the field.

As further depicted in FIG. 1, various fluid compartments 110 are located in the reservoir 102. A "fluid compartment" refers to an independent container of fluids that is either isolated from another container, or that has a restricted fluid flow to another container. Note that the definition of the boundary of compartments is related to the scale of the model. In oil and gas reservoirs there can be compartments of any size ranging from the micro-pore size (micrometers) to the entire reservoir size (tens of kilometers or more). The reservoir can be considered as a single compartment—indeed the hydrocarbon fluids the reservoir contains are trapped in a geological structure that was prevented from significant leaks for a long time (e.g., millions of years). Treating the reservoir as one homogeneous compartment however does not lead to very accurate predictions of fluid flows in the various zones of the reservoir. The presence in the reservoir of sealing faults, tight rock layers such as shales or evaporites, mineralized fractures, stylolite barriers, tar mats, etc., is the reason why compartments are created over geological times. As more and more of these details are incorporated into the reservoir model, many compartments can be defined. However because reservoir heterogeneities exist at all scales, one has to limit the number of compartments in the model in order to be able to make useful predictions. That is why compartments considered in some embodiments are generally relatively large so that the entire reservoir volume is split in a number of compartments small enough to be in line with the amount of monitoring data available to characterize the properties of each compartment. The most common compartments correspond to various vertically stacked porous layers separated by tight layers. However barriers such as sealing faults can also create compartments laterally within a given horizontal layer. Examples of compartments are shown in FIG. 1.

FIG. 1 also shows various wells 112 drilled into the subsurface, where the wells intersect the reservoir 102. The wells 112 can be used to produce fluids from the reservoir 102 towards the ground surface 106 and/or to inject fluids for storage in the reservoir 102.

As a result of fluid-related operations (production or injection) performed with respect to the reservoir 102, one or more of the fluid compartments 110 may compact or expand. Compaction of one or more compartments 110 can cause subsidence at the ground surface 106. Note that expansion of a compartment 110, on the other hand, may cause the ground surface 106 to rise (uplift of the ground surface 106).

It is desired to properly model the compartments of the reservoir 102 such that appropriate decisions can be made regarding strategies for developing the reservoir 102. However, traditionally, building such a reservoir compartment model can be based on a relatively limited amount of data, such as logging data acquired by logging tools run into the wells 112, pressure data regarding the pressures in various parts of the reservoir 102, geochemical analysis of fluids produced, and for mature fields production data history giving pressures and multi-phase flow rates measured over time at the wellheads. The geometry of the compartment model obtained can be quite accurate; however, it is generally very difficult to determine accurately the permeability of the cross-communication between compartments. It is also difficult to calibrate the geomechanical properties that control the modeling of compaction or expansion (more generally "volumetric change") of porous formations within each compartment due to the lack of appropriate and sufficient data. Consequently, a reservoir model may not be able to make accurate predictions, particularly if development (production or injection) of the reservoir 102 over time causes characteristics of the reservoir 102 to change.

To improve the accuracy in generating a compartment model to model compartments in a reservoir, techniques according to some embodiments use satellite measurements taken by the satellites 108 regarding movement (subsidence or uplift) of different areas of the ground surface 106 above the reservoir 102 to calibrate the compartment model.

More specifically, according to some embodiments, an initial compartment model is created to model the compartments 110 of the reservoir 102, as well as the properties of any fluid communication channels between the compartments. Using the compartment model, as well as a geomechanical model, the technique according to an embodiment is able to calculate (predict) movement of different areas of the ground surface 106.

The calculated (predicted) ground surface movement is compared to the actual ground surface movement as measured by the satellite measurements. According to the comparison, properties of the geomechanical model can be adjusted to refine the geomechanical model. The refined geomechanical model is in turn used to refine the compartment model to better characterize the reservoir compartments. Refinement of the geomechanical model allows a more accurate determination of the fluid volumes in corresponding reservoir compartments 110, which provides more accurate knowledge of remaining hydrocarbon reserves in each reservoir compartment 110 and expected extraction rates for the fluids in each reservoir compartment.

FIG. 1 also shows a computer 120 in which software for performing tasks according to some embodiments can be provided. The computer 120 includes a storage 122 (e.g., disk-based storage, integrated circuit storage, etc.) that stores a geomechanical model 124, a compartment model 126, satellite measurements 128 that indicate movement (subsidence or uplift) of corresponding areas of the ground surface 106, and information 130 relating to movement of different areas of the ground surface 106 calculated from the geomechanical model 124 and the compartment model 126.

The satellite measurements 128 can be received from a service that a well operator can subscribe to, for example. The service can be provided by a service provider that is able to request that the satellites 108 make measurements of a particular region. The satellite measurements 128 acquired by the service provider can be communicated over a data network (e.g., wide area network, Internet, etc.) to the computer 120, which may be operated by the well operator.

The computer 120 includes software executable on one or more central processing units (CPUs) 132. The software includes a compartment model software 134 to produce the compartment model 126. Also, the software includes a ground movement calculator 136 for calculating expected movement of the ground surface 106 based on the geomechanical model 124 and the compartment model 126. The calculated movement of the ground surface is stored as the information 130.

In addition, the software also includes a model adjustment module 138 that compares the ground surface movement indicated by the satellite measurements 128 with the calculated ground surface movement (as indicated by information 130), and performs adjustment of one or more properties of the geomechanical model 124 based on the comparison. Using the refined geomechanical model 124, the model adjustment module 138 is able to also refine the compartment model 126 to better characterize the compartments 110 of the reservoir 102.

Figure 2:
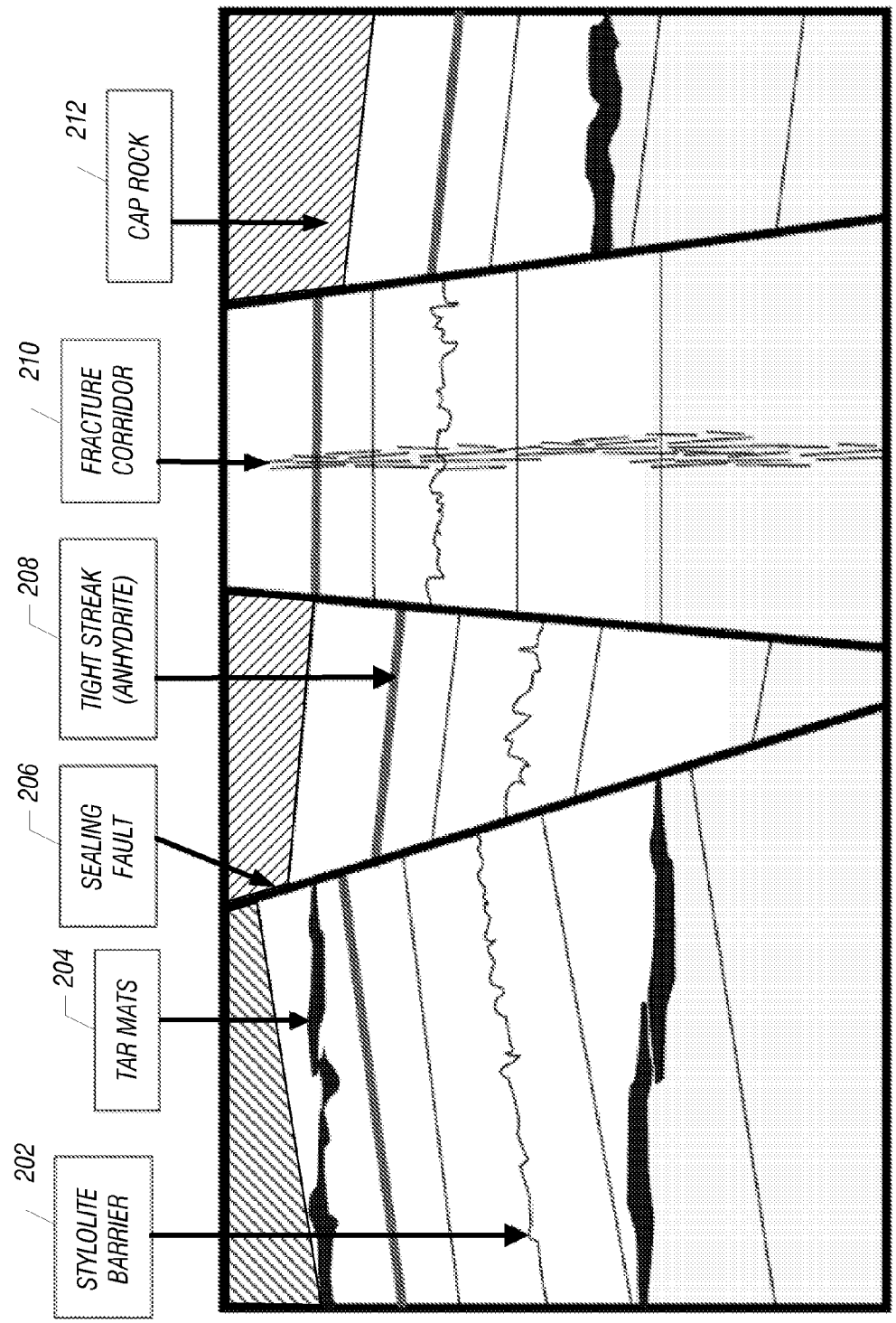
FIGS. 2-4 illustrate compartments in a reservoir.
Figure 3:
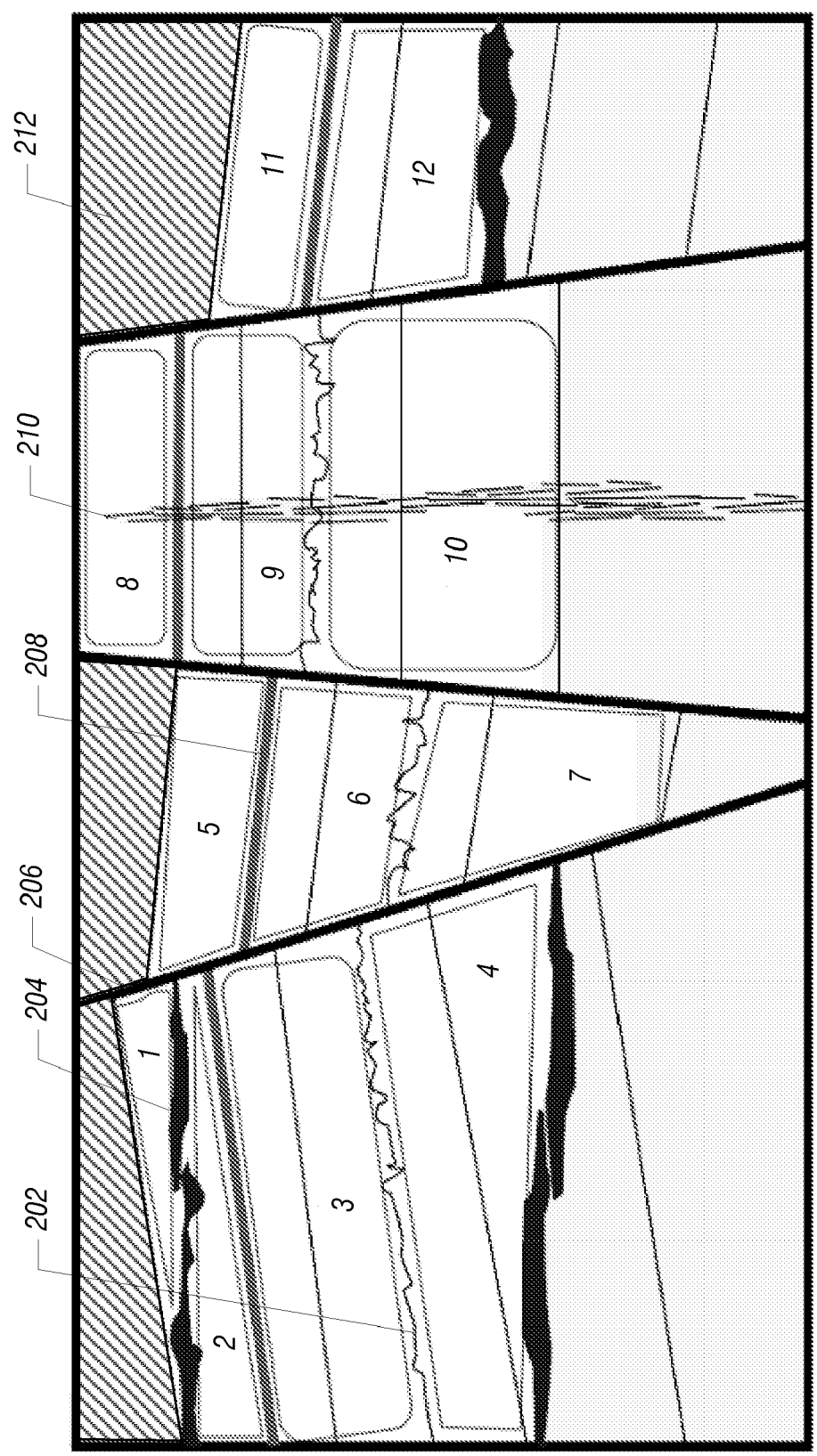

FIG. 2 shows an example portion of a reservoir that has various elements. In the example shown in FIG. 2, the reservoir includes a stylolite barrier 202, tar mats 204, a sealing fault 206, a tight streak (anhydrite) 208, a fracture corridor 210, and a cap rock 212. The various elements shown in FIG. 2 define reservoir compartments that may be present in the portion of the reservoir shown in FIG. 2. Such reservoir compartments (1-12) are depicted in FIG. 3. Note that the various elements of FIGS. 2 and 3 are provided for purpose of example—in other examples, reservoirs can include other elements.

Figure 4:
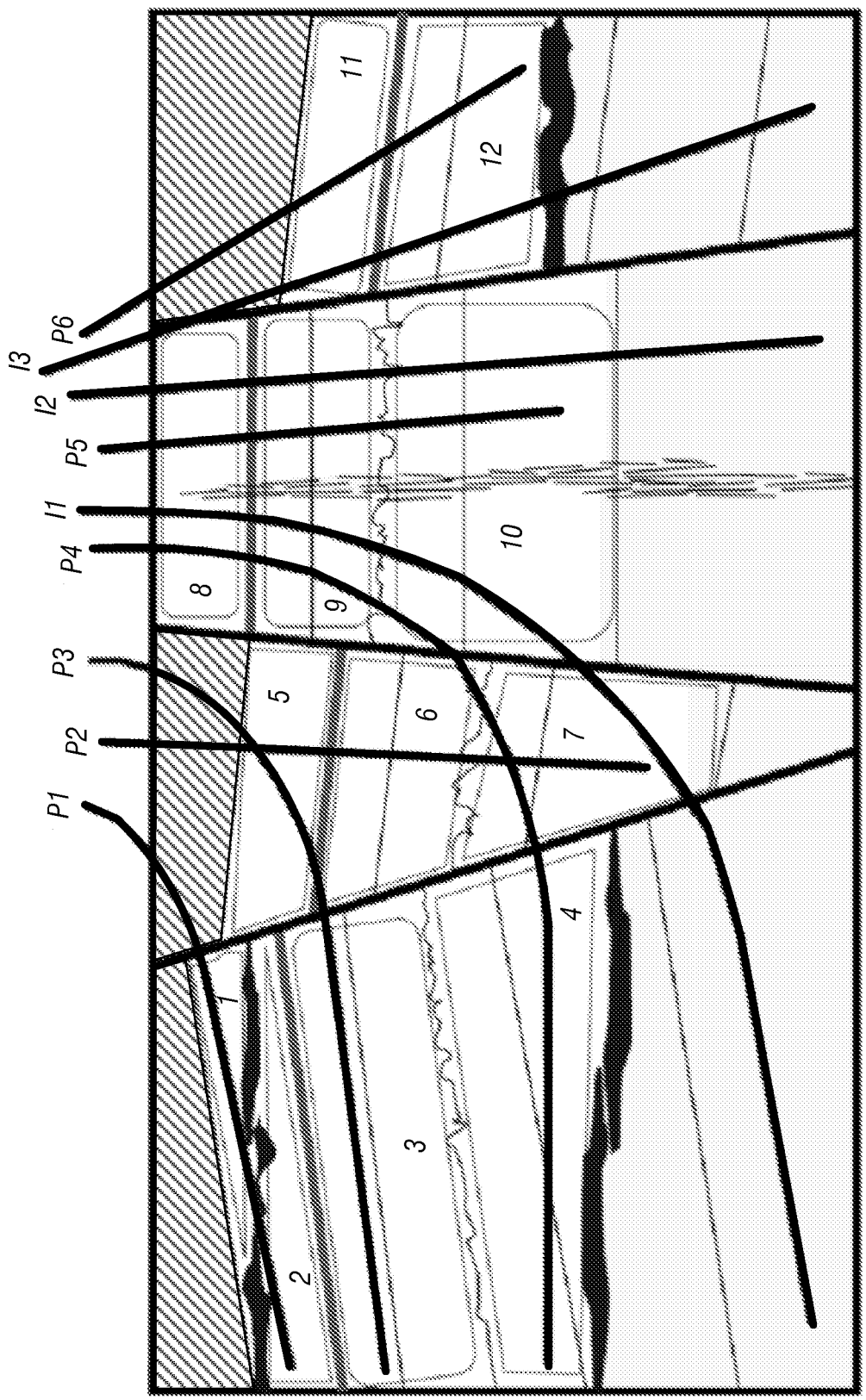

FIG. 4 further shows various wells that can be drilled through the portion of the reservoir shown in FIG. 3, including producer wells P1-P6, and injector wells I1-I3. Producer wells P1-P6 are used to produce fluids from the reservoir, while the injector wells I1-I3 are used to inject fluids into the reservoir. As shown, each of the wells P1-P6 and I1-I3 intersect one or more compartments.

Figure 5:
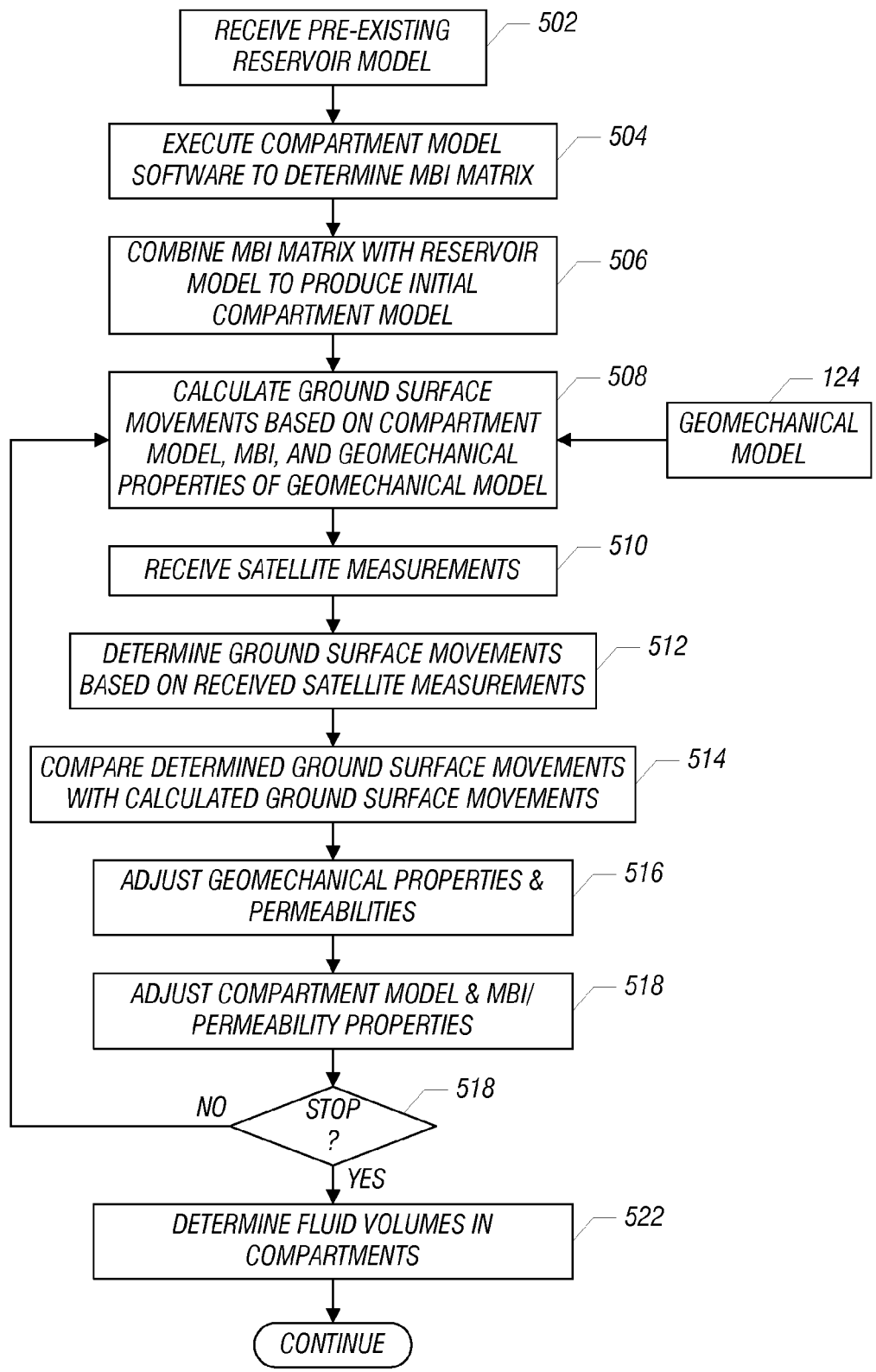
FIG. 5 is a flow diagram of a process according to an embodiment.

FIG. 5 is a flow diagram of a process performed by an embodiment, such as by the software modules of the computer 120 shown in FIG. 1. Although an exemplary flow is depicted, it is noted that in other implementations, the process can be performed in a different order, and some of the elements of FIG. 5 can be omitted. Also, alternatively, instead of being performed with software, the process can be performed with hardware or firmware, or any combination of hardware, firmware, and software. A pre-existing reservoir model is received (at 502), where the reservoir model can be based on seismic data (acquired by seismic surveying), electromagnetic (EM) data (acquired by EM surveying), pressure and flow-rate data (collected by various sensors located in the wells drilled into the subsurface 104 and intersecting the reservoir 102, or at the wellheads on surface), logged data (collected by logging tools run into the wells), and other data. A reservoir model identifies characteristics of different portions of the reservoir, where the characteristics include permeabilities, rock porosities, delineation of flow layers, hydrocarbon saturations, and/or other characteristics.

Next, the compartment model software 134 is executed (at 504) based on historical production data and historical injection data to determine a material balance interference (MBI) matrix. The historical production/injection data includes pressure data, flow rates for various phases (e.g., water, oil, and gas). The historical production/injection data is collected for multiple wells (as many as possible in some implementations) over the life of the wells. The MBI matrix is a matrix of interference coefficients that represent "interference" between compartments of the reservoir. The "interference" between compartments of the reservoir indicates a level of fluid communication between the compartments. A higher value of the interference coefficient indicates that the communication between corresponding compartments is higher, whereas a lower value of the interference coefficient indicates that the communication between corresponding compartments is lower. A high interference coefficient indicates that there is either no or low flow barrier between corresponding compartments. On the other hand, a low interference coefficient indicates that there is a large barrier to fluid flow between corresponding compartments. The MBI matrix includes coefficients between any pair of compartments—theoretically, any compartment in the reservoir can communicate with any other compartment. The MBI provides a quantitative rating of the fluid communication between compartments that can be related to the permeability of these links using an appropriate mathematical function the coefficients of which can be calibrated using the satellite data of the ground surface movement.

The interference coefficients are derived by the compartment model software using the historical production and injection data as input. Initial default values of the interference coefficients can be set by a user based on a priori knowledge. The compartment model software is then executed to perform an iterative optimization process to find interference coefficients. In the iterative optimization process, the interference coefficients are iteratively adjusted to reduce or minimize the difference between calculated pressures in compartments and observed pressures in compartments. Note that the calculated pressures in compartments are influenced by communication with other compartments.

In some embodiments, the iterative optimization process uses a genetics algorithm, which finds optimal solutions from a population of candidate solutions. The candidate solutions are represented by "individuals" that are in the form of chromosomes. The genetics algorithm starts with an initial population of randomly generated individuals within a first generation. In the first generation, the fitness of each individual is evaluated, and multiple individuals are selected from the population based on their fitness. The selected individuals are then combined to form a next generation of individuals, and the fitness evaluation procedure is re-performed. The above process is iteratively performed until a stopping criterion is satisfied, at which point an optimal or near optimal solution has been identified, which in the context of some embodiments includes the interference coefficients that make up the MBI matrix.

The MBI matrix is then combined (at 506) by the compartment model software 134 with the pre-existing reservoir model (received at 502) to produce an initial compartment model 126. The initial compartment model is determined by identifying reservoir regions of similar behavior to produce compartments. The reservoir model identifies characteristics of different regions of the reservoir. Such characteristics can be analyzed to determine which regions are similar, which is based on clustering of the characteristics to identify the regions. An example technique of clustering of regions is described in Al-Thuwaini et al., "Innovative Approach to Assist History Matching Using Artificial Intelligence," SPE 99882 (2006), which is hereby incorporated by reference.

The MBI matrix is also used to assist in more accurately clustering regions of the reservoir to identify reservoir compartments. The interference coefficients in the MBI matrix assist in defining which parts of the reservoir freely communicate with each other and which part do not communicate or have limited (restricted) fluid communication (due to flow barriers).

Next, the ground movement calculator 136 calculates (at 508) the ground movements of different areas of the ground surface 106 that correspond to compaction or expansion (volumetric change) of the reservoirs. The calculated ground surface movements of the different areas of the ground surface are computed based on the compartment model, the MBI and geomechanical properties of the geomechanical model 124. Examples of geomechanical properties include one or more of the following: a Young's modulus property (bulk modulus property), which is a measure of the stiffness of an isotropic elastic material; a Poisson's ratio property (shear modulus property), which is the ratio of the relative contraction strain, or transverse strain) to the relative extension strain, or axial strain); a Mohr-Coulomb model that describes the response of a material to shear stress and normal stress; or other properties.

The MBI and the geomechanical properties of the geomechanical model can be used to predict expected changes in volumes of the reservoir compartments that result from fluid production and/or injection over time. The changes in volumes of the reservoir compartments are then used to predict the movements of subterranean layers above the reservoir compartments. The predicted movements of the subterranean layers above the reservoir compartments are derived based on the MBI and the geomechanical properties of the subterranean layers, as represented by the geomechanical model. The predicted movements of the subterranean layers are then used to predict (calculate) movements of areas of the ground surface 106.

In addition, satellite measurements are received (at 510) that indicate ground movements in different areas of the ground surface 106 above the reservoir 102. Based on the received satellite measurements, the ground surface movements of different areas of the ground surface 106 are determined (at 512).

Next, the ground surface movements determined from the satellite measurements are compared (at 514) with the calculated ground surface movements by the model adjustment module 138. Based on the comparison, the model adjustment module 138 adjusts (at 516) one or more properties of the geomechanical model (some example geomechanical properties are discussed further above) to refine the geomechanical model, as well as the permeabilities between compartments derived from the MBI. The comparison of ground surface movements determined from satellite measurements and the calculated ground surface movements produce errors that can be used to adjust the geomechanical properties and the MBI/permeability properties to better fit observed behavior. In addition, the compartment model is adjusted (at 518) based on adjustment of the geomechanical model.

Optionally, the reservoir model can also be adjusted based on the adjustment of the geomechanical and compartment models. This may be useful in the context of four-dimensional (4D) or time-lapse surveying (e.g., 4D seismic surveying or 4D electromagnetic surveying). With 4D surveying, multiple surveys are conducted at different times. 4D surveying often use an initial reservoir model. By refining the reservoir model as discussed above, superior results can be achieved with 4D surveying.

Next, the procedure determines (at 520) if a stopping criterion has been satisfied (e.g., a predetermined number of iterations have been performed, the determined and calculated ground movements are within a predefined percentage threshold of each other, etc.). If the stopping criterion has not been satisfied, then the procedure loops back to task 508 to again repeat the procedure, using the refined geomechanical model and compartment model.

If the stopping criterion has been satisfied, then the procedure proceeds to determine (at 522) fluid volumes within the compartments of the reservoir 102. The fluid volumes within the compartments are a function of the compaction or expansion of the respective compartments, pressures within the compartments, production/injection history, and so forth. Once the compartments of the reservoir are better characterized using techniques according to some embodiments, an operator will be able to more accurately predict the remaining fluid reserves in the reservoir and expected extraction rates of such fluids.

Figure 6:
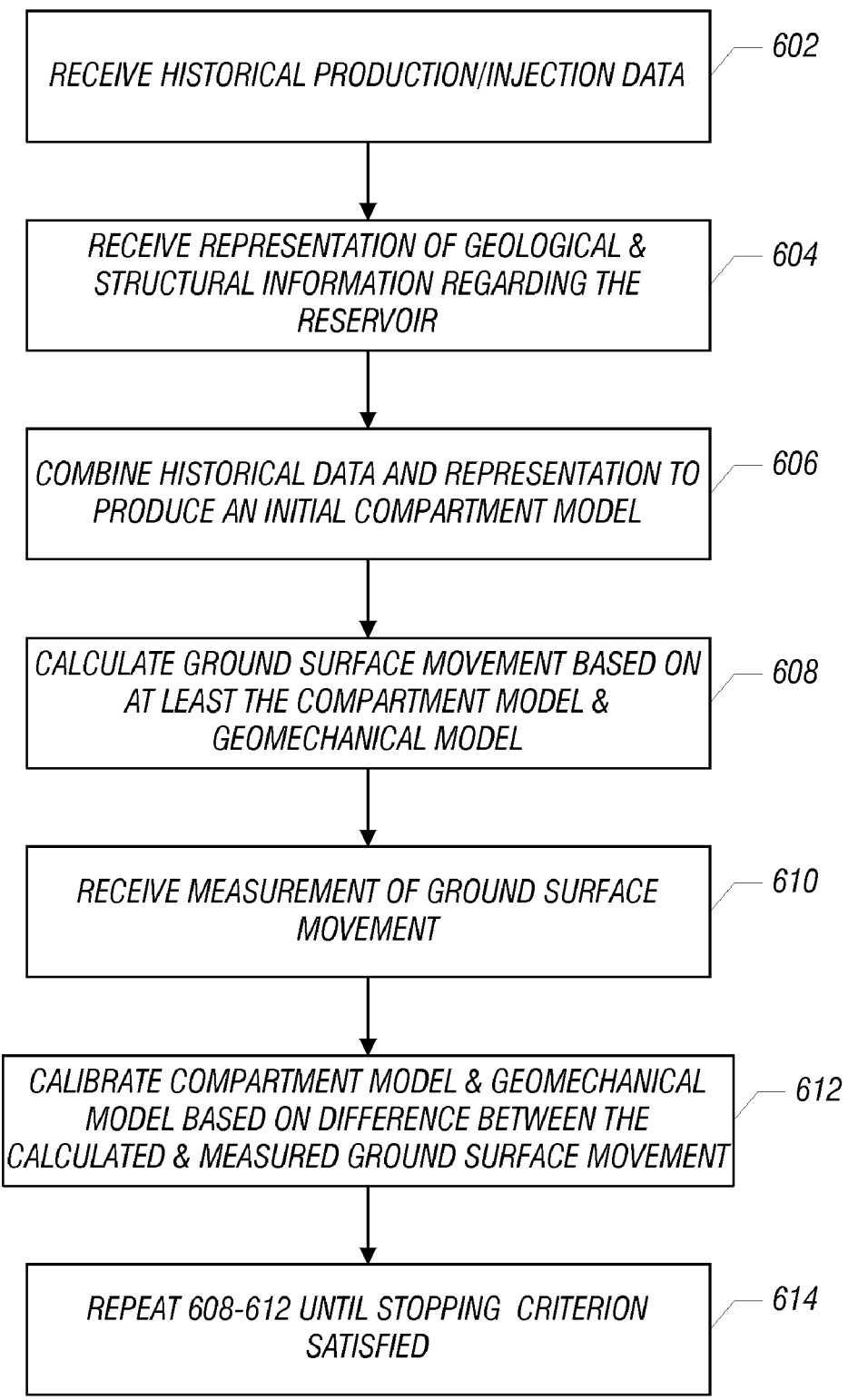
FIG. 6 is a flow diagram of a more generalized process according to an embodiment.

FIG. 6 illustrates a more generalized view of a process according to some embodiments. The process of FIG. 6 receives (at 602) historical data relating to fluid-related operations (fluid production and/or fluid injection operations) performed with respect to a reservoir. In addition, a representation of geological and structural information regarding the reservoir is received (at 604). In some embodiments, the representation of the geological and structural information is in the form of a reservoir model, similar to the reservoir model described in connection with FIG. 5.

Next, the historical data relating to fluid-related operations is combined (at 606) with the representation to derive a compartment model of fluid compartments in the reservoir. Deriving the compartment model of the fluid compartments in the reservoir involves generating an MBI matrix as described above. The MBI matrix is used to produce the compartment model.

Using at least the compartment model and a geomechanical model, ground surface movement is calculated (at 608). In addition, measured ground surface movement is received (at 610). In some embodiments, the measured ground surface movement includes ground surface movement measured by the satellites 108 of FIG. 1.

Next, the compartment model and the geomechanical model are calibrated (at 612) based on a difference between the calculated ground surface movement and the measured ground surface movement. The tasks 608, 610, and 612 are then iteratively repeated until a stopping criterion is satisfied.

Instructions of software described above (including software modules 134, 136, and 138 of FIG. 1) are loaded for execution on a processor (such as one or more CPUs 132 in FIG. 1). The processor includes microprocessors, microcontrollers, processor modules or subsystems (including one or more microprocessors or microcontrollers), or other control or computing devices. A "processor" can refer to a single component or to plural components (e.g., single or plural CPUs).

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While a limited number of embodiments have been disclosed, those skilled in the art, having the benefit of this disclosure, will appreciate numerous modifications and variations therefrom. It is intended that the appended claims cover such modifications and variations as fall within the true spirit and scope of the invention.

What is claimed is:

1. A method executed by a computer of modeling a reservoir in a subterranean structure, comprising:
generating a compartment model of fluid compartments in the reservoir wherein the generating comprises using historical data to compute a matrix of material balance interference coefficients that represent barriers to fluid communication in the reservoir;
based on the compartment model and a geomechanical model of the subterranean structure, calculating movement of a ground surface due to volumetric change of the compartments;
receiving satellite measurements of the ground surface over time, wherein the received satellite measurements of the ground surface over time indicate movement of the ground surface;
comparing the movement of the ground surface indicated by the received satellite measurements with the calculated movement; and
adjusting at least one property of the geomechanical model according to the comparing.

2. The method of claim 1, wherein calculating the movement of the ground surface due to volumetric change of the compartments comprises calculating the movement of the ground surface due to one of compaction and expansion of the compartments.

3. The method of claim 1, wherein calculating the movement of the ground surface comprises calculating the movement selected from the group consisting of subsidence of the ground surface and uplift of the ground surface.

4. The method of claim 1, wherein generating the compartment model comprises determining characteristics of regions of the reservoir based on a reservoir model and clustering the regions based on their characteristics.

5. The method of claim 1, further comprising:
updating the compartment model based on adjusting the geomechanical model.

6. The method of claim 5, further comprising:
repeating the calculating and comparing tasks using the updated compartment model and the updated properties of the geomechanical model.

7. The method of claim 1, wherein the received satellite measurements are indicative of movements of different areas of the ground surface, wherein calculating the movement of the ground surface comprises calculating movements of different areas of the ground surface, and wherein the movements of different areas of the ground surface indicated by the received satellite measurements are compared with the calculated movements of different areas of the ground surface.

8. The method of claim 1, further comprising determining fluid volumes in the compartments of the reservoir using the compartment model.

9. A method executed by a computer, comprising:
receiving historical data relating to fluid-related operations performed with respect to a reservoir;
receiving a representation of geological and structural information regarding the reservoir;
combining the historical data with the representation to derive a compartment model of fluid compartments in the reservoir by generating a matrix using the historical data, wherein the matrix comprises material balance interference coefficients that represent interference between the compartments in the reservoir;
calculating ground surface movement using at least the compartment model and a geomechanical model;
receiving measured ground surface movement; and
calibrating the compartment model and the geomechanical model based on a difference between the calculated ground surface movement and the measured ground surface movement.

10. The method of claim 9, wherein the calculating the ground surface movement, receiving the measured ground surface movement, and calibrating the compartment model and geomechanical model are repeated iteratively until a stopping criterion is satisfied.

11. The method of claim 9, wherein receiving the historical data comprises receiving the historical data regarding fluid-related operations selected from the group consisting of fluid production operations and fluid injection operations.

12. The method of claim 9, wherein receiving the measured ground surface movement comprises receiving ground surface movement measured by satellites.

13. The method of claim 9, wherein using the matrix to produce the compartment model comprises combining the matrix with a reservoir model to produce the compartment model, wherein the reservoir model is the representation of geological and structural information regarding the reservoir.

14. The method of claim 13, wherein calculating the ground surface movement is further based on the matrix.

15. An article comprising one or more non-transitory computer-readable storage media containing instructions that when executed by a computer causes the computer to:
receive historical data relating to fluid-related operations performed with respect to a reservoir;
generate a compartment model of fluid compartments in the reservoir using the historical data to compute a matrix of material balance interference coefficients that represent barriers to fluid communication in the reservoir;
based on the compartment model and a geomechanical model of the subterranean structure, calculate movement of a ground surface due to compaction or expansion of the compartments;
receive satellite measurements of the ground surface over time, wherein the received satellite measurements of the ground surface over time indicate movement of the ground surface; and
calibrate the geomechanical model and the compartment model according to a difference between the calculated movement of the ground surface and the movement of the ground surface as measured by the satellite measurements.

16. The article of claim 15, wherein receiving the historical data comprises receiving the historical data for a plurality of wells that intersect the reservoir.

* * * * *